United States Patent [19]
Wall et al.

[11] Patent Number: 6,054,676
[45] Date of Patent: Apr. 25, 2000

[54] METHOD AND APPARATUS FOR COOLING AN INTEGRATED CIRCUIT DEVICE

[75] Inventors: Charles B. Wall, Irmo; Johnston W. Peeples, Columbia; Terry Craps; Robert DiGiacomo, both of Lexington, all of S.C.

[73] Assignee: Kryotech, Inc., West Columbia, S.C.

[21] Appl. No.: 09/020,766

[22] Filed: Feb. 9, 1998

[51] Int. Cl.[7] .............................. H05B 1/00; H05B 7/20; F28D 15/00
[52] U.S. Cl. .................... 219/209; 361/719; 165/104.33
[58] Field of Search ........................ 219/209; 361/743, 361/760, 711, 719; 165/104.33; 62/3.7

[56] References Cited

U.S. PATENT DOCUMENTS

| | | | |
|---|---|---|---|
| 3,412,566 | 11/1968 | Townsend et al. | 62/3 |
| 3,786,172 | 1/1974 | Conley | 174/68.5 |
| 4,394,711 | 7/1983 | Conley | 361/408 |
| 4,481,403 | 11/1984 | Del Monte | 219/209 |
| 5,040,381 | 8/1991 | Hazen | 62/3.2 |
| 5,089,688 | 2/1992 | Fang et al. | 219/505 |
| 5,148,003 | 9/1992 | Haj-Ali-Ahmadi et al. | 219/388 |
| 5,329,426 | 7/1994 | Villani | 361/719 |
| 5,343,358 | 8/1994 | Hilbrink | 361/700 |
| 5,365,749 | 11/1994 | Porter | 62/259.2 |
| 5,427,984 | 6/1995 | Hilbrink | 437/214 |
| 5,440,172 | 8/1995 | Sutrina | 257/712 |
| 5,473,508 | 12/1995 | Porter et al. | 361/695 |
| 5,476,399 | 12/1995 | Porter | 439/843 |
| 5,489,750 | 2/1996 | Sakemi et al. | 174/261 |
| 5,495,394 | 2/1996 | Kornfeld et al. | 361/764 |
| 5,513,152 | 4/1996 | Cabaniss | 368/118 |
| 5,515,683 | 5/1996 | Kessler | 62/3.7 |
| 5,549,155 | 8/1996 | Meyer, IV et al. | 165/104.33 |
| 5,574,627 | 11/1996 | Porter | 361/719 |
| 5,581,441 | 12/1996 | Porter | 361/701 |
| 5,594,609 | 1/1997 | Lin | 361/104 |
| 5,613,364 | 3/1997 | Higgins | 62/3.2 |
| 5,821,505 | 10/1998 | Tustaniwskyj et al. | 219/494 |
| 5,844,208 | 12/1998 | Tustaniwskyj et al. | 219/494 |

*Primary Examiner*—Teresa Walberg
*Assistant Examiner*—Daniel Robinson
*Attorney, Agent, or Firm*—Womble Carlyle Sandridge & Rice, PLLC

[57] ABSTRACT

An apparatus for cooling an integrated circuit device includes a sealed thermally insulated chamber containing the integrated circuit device. A cooling element is located in chamber and is in thermal contact with the integrated circuit device for cooling the device. The integrated circuit device is mounted in a socket having socket pins that extend through a heater board forming one side of the device to projecting exposed external end portions. A heating element in the form of a polymer thick film resistor is deposited on the heater board on the inside of the chamber in the vicinity of the socket pins. The heating element is activated as necessary by a thermostatic control circuit to maintain the temperature of the exposed external end portions of the socket pins above a predetermined threshold to prevent moisture condensation on the projecting portions of the pins.

24 Claims, 7 Drawing Sheets

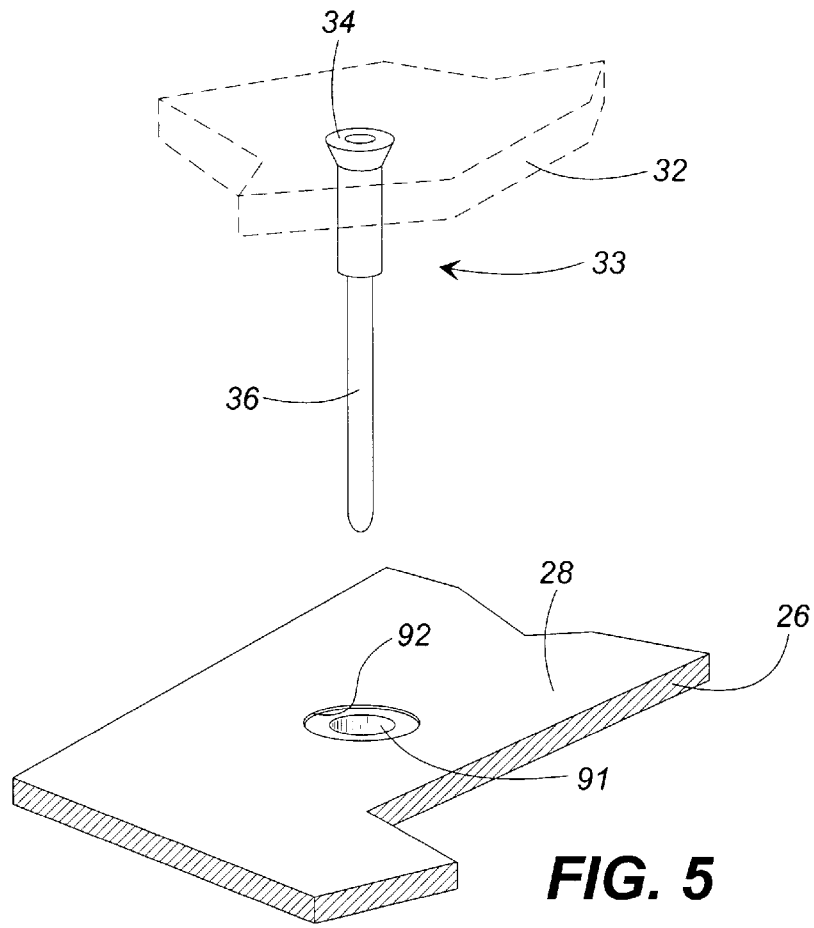
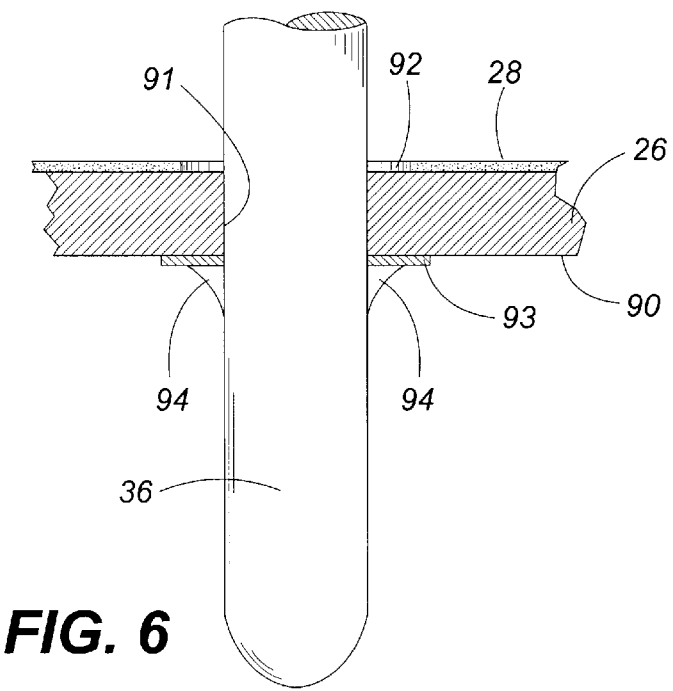

METHOD AND APPARATUS FOR COOLING AN INTEGRATED CIRCUIT DEVICE

TECHNICAL FIELD

The present invention relates generally to integrated circuit devices such as the central processing units (CPUs) of computers and more particularly to the cooling of such devices to below ambient temperatures for improved efficiency and enhanced speed of operation.

BACKGROUND OF THE INVENTION

It is well known in the electronics industry that the cooling of complementary metal oxide semiconductor (COMOS) integrated circuit devices can substantially enhance the efficiently and speed at which such devices can operate. Such cooling is particularly benificial in the case of CPUs that form the heart of modern day computers. In some cases, it has been found that the clock speed at which a CPU processes programming instructions can increased nearly 300% by cooling the CPU to a temperature of approximately −200° C.

To take advantage of the greatly increased processing speeds achievable with cooled CPUs, a variety of methods and devices have been developed for cooling CPUs and, for that matter, other integrated circuit devices, to below ambient temperatures. One such device comprises a hollow cold plate, which is thermally coupled to a CPU or other integrated circuit device to be cooled. A coolant is circulated from a refrigeration unit through connecting conduits to the cold plate to effectuate cooling of plate and, in turn, of the integrated circuit device. Other known cooling methods include immersion of a CPU module in a coolant such as liquid nitrogen, or interfacing the CPU module with a peltier TEC (thermal electric cooling) device.

One example of an apparatus for cooling an integrated circuit device is disclosed in U.S. Pat. No. 5,574,627 of Porter. In the Porter apparatus, a CPU is mounted in a socket within a sealed insulated chamber. A cryrogenically cooled cold plate is disposed atop and in contact with the CPU within the insulated chamber. The socket pins of the socket project out of the chamber for being soldered or otherwise electrically coupled to the mother board of a computer for electronically coupling the CPU within the sealed chamber to other components of the computer. In use, the CPU is cooled to a desired below ambient temperature by circulating an appropriate refrigerant through the cold plate.

While the apparatus disclosed in Porter functions well to cool a CPU, it nevertheless exhibits certain problems and shortcomings inherent in its design. For example, in column 4, beginning at line 19, it is recognized by Porter that the chilling of the CPU within the sealed chamber also chills the socket pins within the chamber. As a result, the protruding exposed ends of the socket pins, which project out of the chamber and are mounted to the mother board, are also chilled through thermal conduction from the interior of the sealed chamber. The resulting problem is that when the temperature of the exposed ends of the socket pins falls below the local dew point, moisture begins to condense on the exposed pins and on surrounding elements of the mother board. Such condensation is highly undesirable because it can cause temporary or permanent damage to electrical components within a computer in which the cooling system is employed.

In order the address the problem of condensation caused by conductive chilling of these exposed metal pins, Porter teaches that a sealed insulator be mounted to the bottom of the mother board covering the exposed chilled socket pins and isolating them from ambiance. However, this is not a complete solution to the condensation problem for a variety of reasons. First, the interior of the lower insulator in which the pins are housed still contains air with some humidity and some dew point. Accordingly, moisture can still form on the pins enclosed within the lower insulator. This moisture can degrade the electrical connections of the pins to the mother board and, over time, can lead to failure of the circuit. In addition, the solution proposed by Porter requires that additional bulk be added to the back of the circuit board, which is undesirable because space is a premium within modern computers, and also requires that a seal of high integrity be formed and maintained between the lower insulator and the bottom of the mother board. Further, the outer surface of the cooling chamber on top of the mother board must also be sealed to the mother board to prevent ambient air from entering the space between the cooling chamber and the surface of the mother board, to prevent condensation on the exposed portions of the pins in this region. Since it is very difficult to maintain the integrity of such seals for long periods of time, ambient air can still seep into the regions around the chilled pins and condensation can still occur. Thus, Porter's solution to the problem of condensation is incomplete and is also inefficient because it calls for additional components and installation steps.

Accordingly, there exists a need for a reliable, efficient, and economical method and apparatus for chilling integrated circuit devices such as computer CPUs to below ambient temperatures while at the same time preventing the formation of condensation on connector pins or other exposed elements of the cooling apparatus. Preferably, this should be accomplished without requiring any special treatment of the mother board and without requiring installation of auxiliary insulating chambers or other ancillary elements, but such is not a limitation of the invention. It is to the provision of such an apparatus that the present invention is primarily directed.

SUMMARY OF THE INVENTION

Briefly described, the present invention, in one preferred embodiment thereof, comprises an improved apparatus for cooling an integrated circuit device of the type having projecting connector pins while preventing any condensation on exposed surfaces of the apparatus. The invention is particularly suited for cooling computer CPUs to enhance their efficiency and increase the clock speed at which they can be operated. The apparatus includes a generally planar heater board having an array of openings formed therein. A socket is mounted to the heater board for receiving and electrically coupling to an integrated circuit device such as a CPU to be cooled. The socket includes a base member and an array of elongated socket pins projecting from the base member through the openings in the heater board to exposed external ends. The exposed external ends of the socket pins are in turn connected to a mother board or other electronic circuit board for coupling a CPU held in the socket into the circuit. Each of the socket pins defines a receptacle on the base member of the socket for receiving and coupling to a corresponding connector pin of the integrated circuit device.

The socket pins are sealed in the openings formed in the heater board and a housing is mounted and sealed to the top of the heater board. The housing defines a thermally insulated internal cavity sized to contain a CPU mounted in the socket. A thermally conductive cooling element in the form of a cold plate is disposed in the insulated cavity and is positioned atop and in thermal contact with the CPU. The cold plate is coupled to a cooling system, which provides a refrigerant to chill the cold plate to below ambient temperatures and, in turn, to chill the CPU to similar temperatures.

In order to prevent chilling of the exposed ends of the socket pins, a heating element in the form of a polymer thick film (PTF) resistor is deposited by a silk screen or other technique on the inside surface of the heater board, which comprises an external wall of the sealed chamber. The thick film resistor is deposited throughout the region of the heater board where the socket pins extend through the heater board but is electrically isolated from each of the pins. A thermostatic monitoring and control circuit is mounted on the heater board and includes a temperature sensor on the outside surface of the heater board for monitoring the temperature of the exposed portions of the socket pins that project from the device. When this temperature falls below a predetermined threshold, the control circuit supplies power to the heating element, which is ohmically heated. This heat is conducted to and heats the exposed socket pins until their temperature rises above the predetermined threshold. In practice, the threshold is chosen to be slightly higher than the ambient temperature. In this way, the projecting exposed socket pins, which are soldered or otherwise mounted in a mother board or other electronic circuit board, are maintained above the local dew point and no condensation of moisture can occur on the pins.

Thus, an apparatus for cooling an integrated circuit device is now provided that addresses the problems and shortcomings of the prior art. Specifically, the problem of moisture condensation on the exposed end portions of the socket pins of the apparatus is eliminated by maintaining the exposed pins at a temperature higher than the local dew point. Since the exposed pins are not subject to condensation in the first place, it is not necessary to provide any ancillary insulators, seals, or other special treatment to isolate the exposed pins from ambiance, as has been required with prior art devices. The solution embodied in the present invention is thus economical, efficient, and reliable and represents a novel advance over the prior art.

It is therefore an object of the present invention to provide an apparatus for cooling an integrated circuit device that addresses the problems of condensation inherent in prior art cooling devices.

It is another object of the present invention to provide a cooling system for an integrated circuit device that eliminates the need to isolate the exposed connector pins of the system with ancillary insulators or other components.

A further object of the invention is to provide a new and novel method of preventing moisture condensation on the exposed end portions of the socket pins of an integrated circuit cooling device that does not rely upon seals between the device and an electronic circuit board on which the device is mounted.

Another object of the invention is to prevent moisture condensation on projecting pins of an integrated circuit cooling system with a device that can be manufactured with automated machinery using standard printed circuit board techniques.

These and other objects, features, and advantages of the invention will become more apparent upon review of the detailed description set forth below when taken in conjunction with the accompanying drawings, with are briefly described as follows.

BRIEF DESCRIPTION OF THE DRAWINGS

FIG. 5 is a perspective cut-away drawing showing a small portion of the heater board and illustrating a preferred method of electrically isolating the heating element from the socket pins that project through the heater board.

FIG. 6 is a side cross-sectional view of a small section of the heater board illustrating isolation of the heating element from the socket pins and a preferred method of sealing the socket pins within the heater board.

DETAILED DESCRIPTION OF THE PREFERRED EMBODIMENTS

Figure 1:
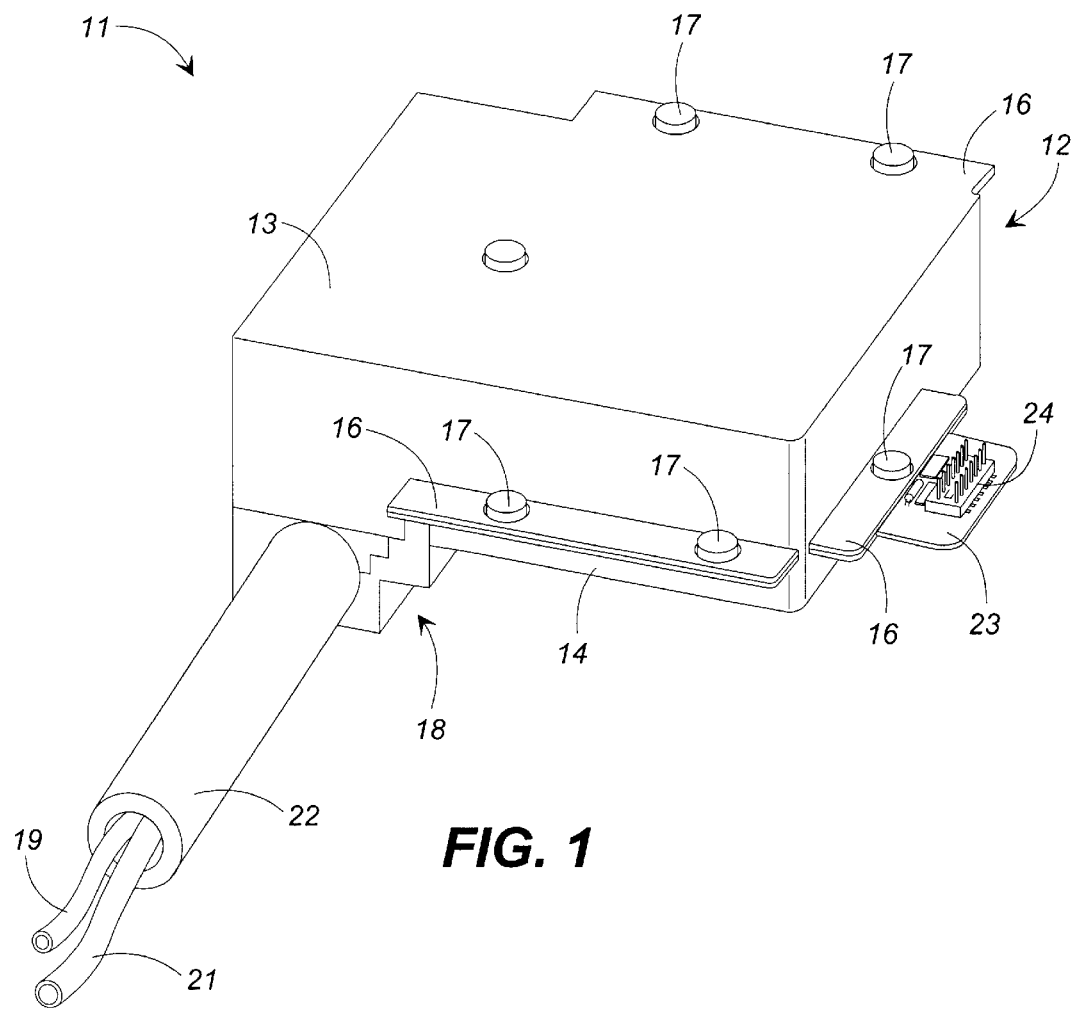
FIG. 1 is a top perspective view of an integrated circuit cooling apparatus that embodies principles of the present invention in a preferred form.

Referring now in more detail to the drawings, in which like numerals refer to like parts throughout the several views, FIG. 1 is a perspective view of an integrated circuit cooling apparatus that embodies principles of the present invention in a preferred form. The integrated circuit device illustrated in the drawings is a computer CPU chip and the description that follows will be presented in the context of cooling a CPU. It should be understood, however, that the present invention is not limited to the cooling of CPUs but is equally applicable to the cooling of virtually any integrated circuit device that can benefit from lower operating temperatures.

The apparatus 11 comprises an outer casing 12 formed by an upper shell 13 and a lower shell 14. The shells 13 and 14 preferably are formed of a sheet metal such as aluminum and are connected together to form the outer casing 12 my means of fasteners 17 such as, for example, bolts that extend through mating flanges 16. The outer casing 12 encloses the thermal housing and other components of the present invention as described in more detail below. A portion of the thermal housing is visible at 18 in FIG. 1. The bottom of the outer casing (not visible in FIG. 1) is open to expose downwardly projecting socket pins that are coupled into the mother board or other printed circuit board of a computer in the usual way. A connector tab 23 of a heater board, described more fully below, projects from the lower shell 14 of the casing 12 and includes a connector header 24 for connecting internal components of the heater board to an outside source of power and data. Coolant delivery line 19 and coolant return line 21 are provided for delivering a coolant to a cold plate located within the casing 12 and an insulating sleeve 22 insulates and isolates the supply and return lines and prevents condensation thereon. The coolant, which can be freon or a modern freon substitute, evaporates as it moves through the cold plate to cool the cold plate to below ambient temperatures and, in turn, to cool a CPU on which the cold plate is mounted.

Figure 2:
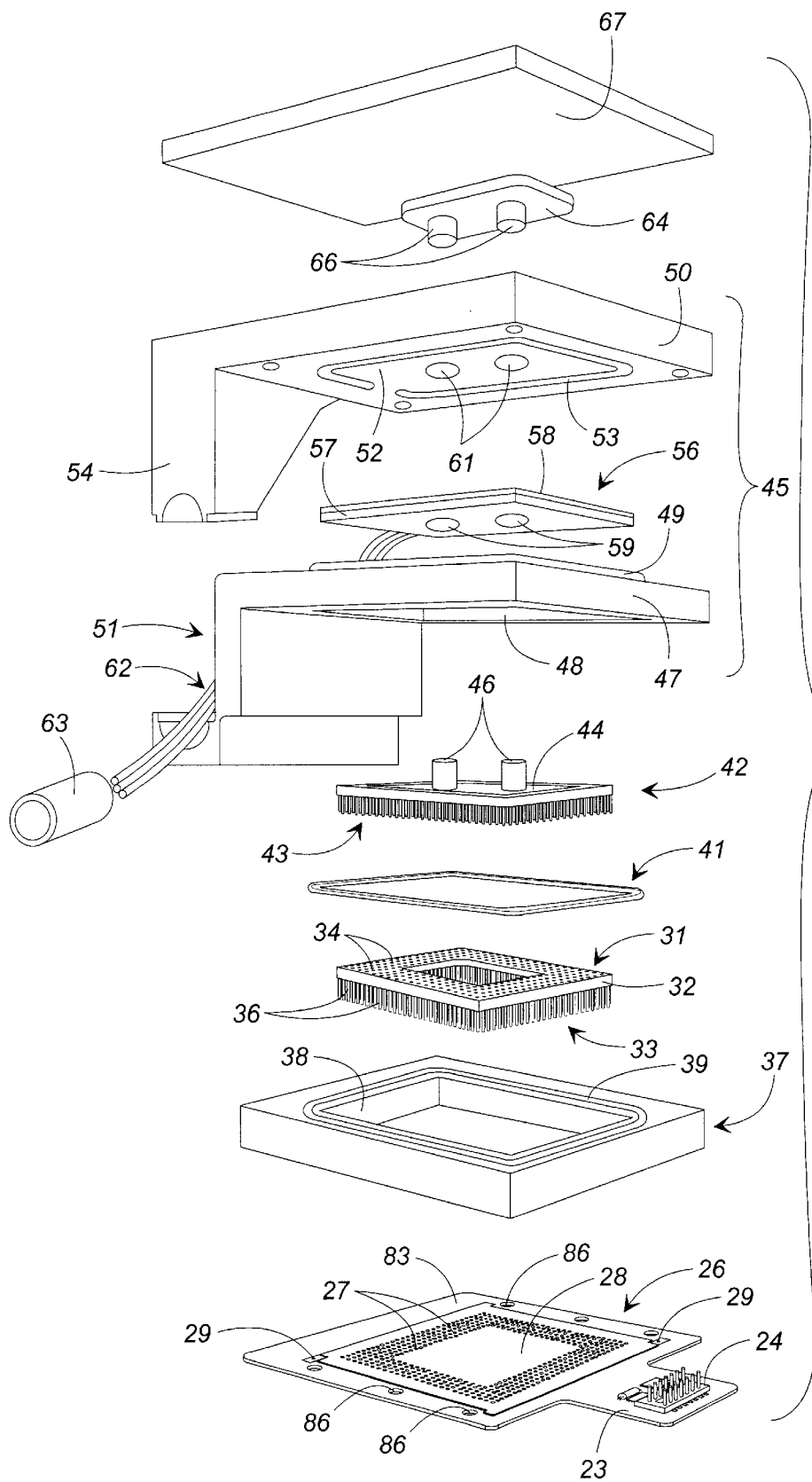
FIG. 2 is a perspective exploded view of the cooling apparatus of FIG. 1, showing the various key components thereof.

FIG. 2 is an exploded perspective view of the invention illustrating the various internal components contained within the outer casing 12. The outer casing itself is omitted for clarity in FIG. 2. The functional components of the present invention include a generally rectangular heater board 26 that forms the bottom plate or wall of the assembly. The heater board 26 preferably is formed of standard printed circuit board material and includes a generally rectangular main board 83 and a connector tab 23 that projects from one side of the of the board. An electrical header or connector 24 is mounted to the connector tab 23 and includes upwardly projecting prongs or pins for attaching the heater board and its various electronic components to an external source of power and data.

The main board 83 of the heater board 26 is punched or drilled to define an array of holes 27 that extend through the heater board 26 to its bottom side. The holes 27 are arranged and configured to receive the pins of a CPU chip socket 31 for mounting the socket 31 to the heater board with its pins projecting through the heater board to exposed end portions. The exposed end portions of the socket pins can then be mounted to a mother board or other printed circuit board in the usual way to couple the socket into an electronic circuit.

A heating element 28 is disposed on a top surface of the heater board 26. In the preferred embodiment, the heating element 28 comprises a polymer thick film (PTF) resistor that is silk screen printed onto the heater board 26 surrounding and permeating the holes 27 formed therethrough. Opposed edge portions of the PTF resistor overlie respective terminal strips 29, which preferably are formed of copper on the surface of the heater board 26 using standard printed circuit board etching technology. With this arrangement, it will be understood that when an electrical potential such as, for example, approximately 30 volts, is applied to the opposed edges of the PTF resistor through the terminal strip 29, current flows through the resistor. This causes the film to be heated through ohmic heating, which, in turn, heats the top surface of the heater board 26. This heat is then transferred to the socket pins that project through the heater board and heats the exposed end portions of the pins for purposes described in more detail below.

A generally rectangular insulating carrier 37 is formed with an interior rectangular opening 38 and is sized to be mounted and sealed to the heater board 26 extending about the periphery thereof. Preferably, the insulating carrier 37 is molded from standard reaction injection molded (RIM) foam, which provides superior thermal insulation with minimum bulk and weight. The insulating carrier 37 can be sealed to the peripheral portion of the heater board 26 by means of an appropriate epoxy and can be further secured if desired with fasteners that extend through openings 86 in the heater board and into the material of the insulating carrier 37. A gasket seat 39 is formed in the top surface of the insulating carrier 37 and surrounds the central rectangular opening 38 formed therein.

The central opening 38 of the insulated carrier 37 is sized to receive and surround a socket 31 into which a CPU can be mounted. The socket 31 is a standard CPU socket available from a number of electronic supply outlets and comprises a square or rectangular base 32 having an array of socket pins 33 embedded therein. The socket pins 33 are formed with socket portions 34 that are exposed on the top surface of the base 32 for receiving the connector pins of a CPU chip 42, and elongated socket pins or legs 36 that project downwardly from the base for mounting to the heater board 26.

Figure 4:
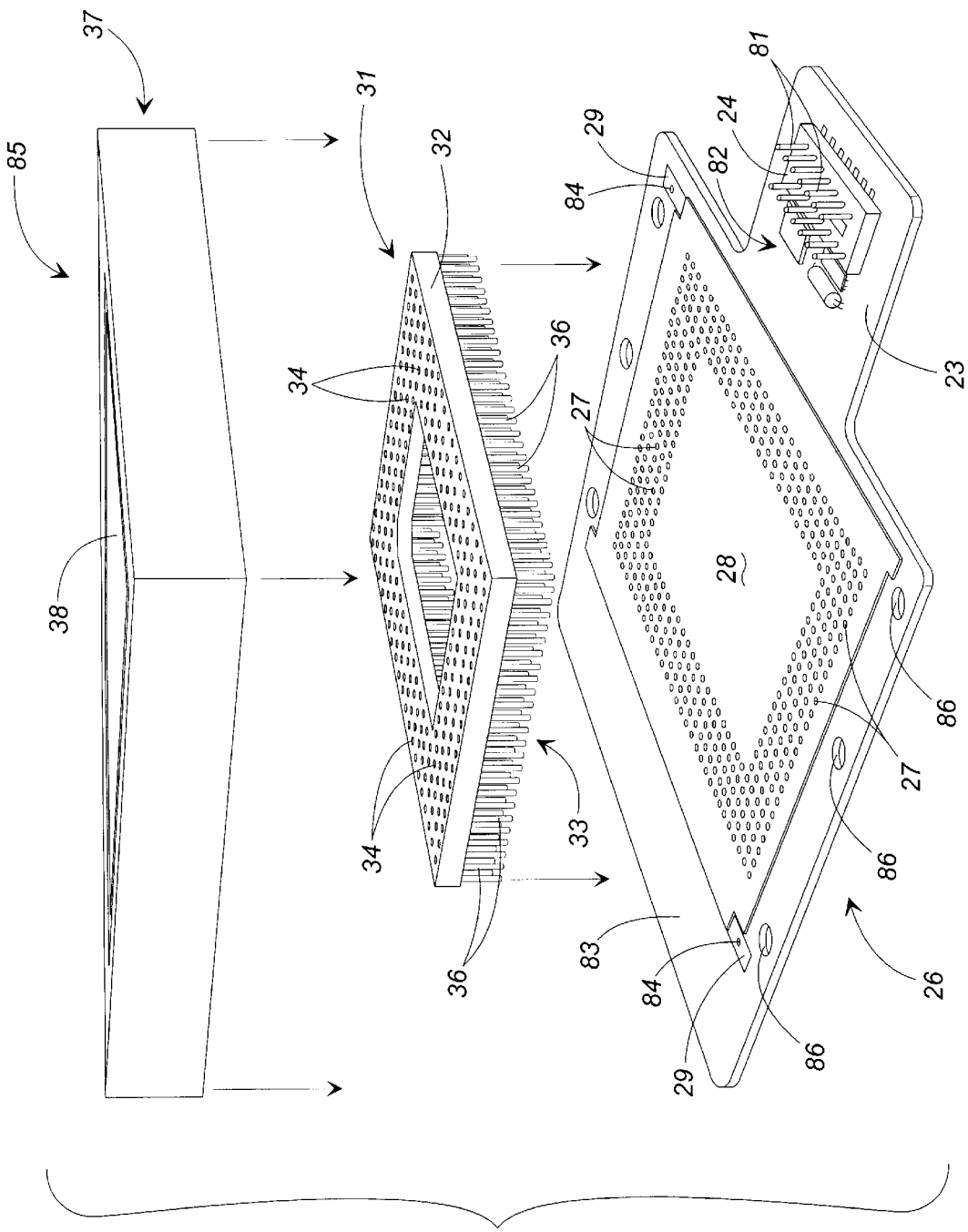
FIG. 4 is an exploded perspective view of the thermal socket portion of the present invention illustrating the heating element and control circuit for maintaining the temperature of the projecting socket pins above a predetermined threshold.
Figure 4A:
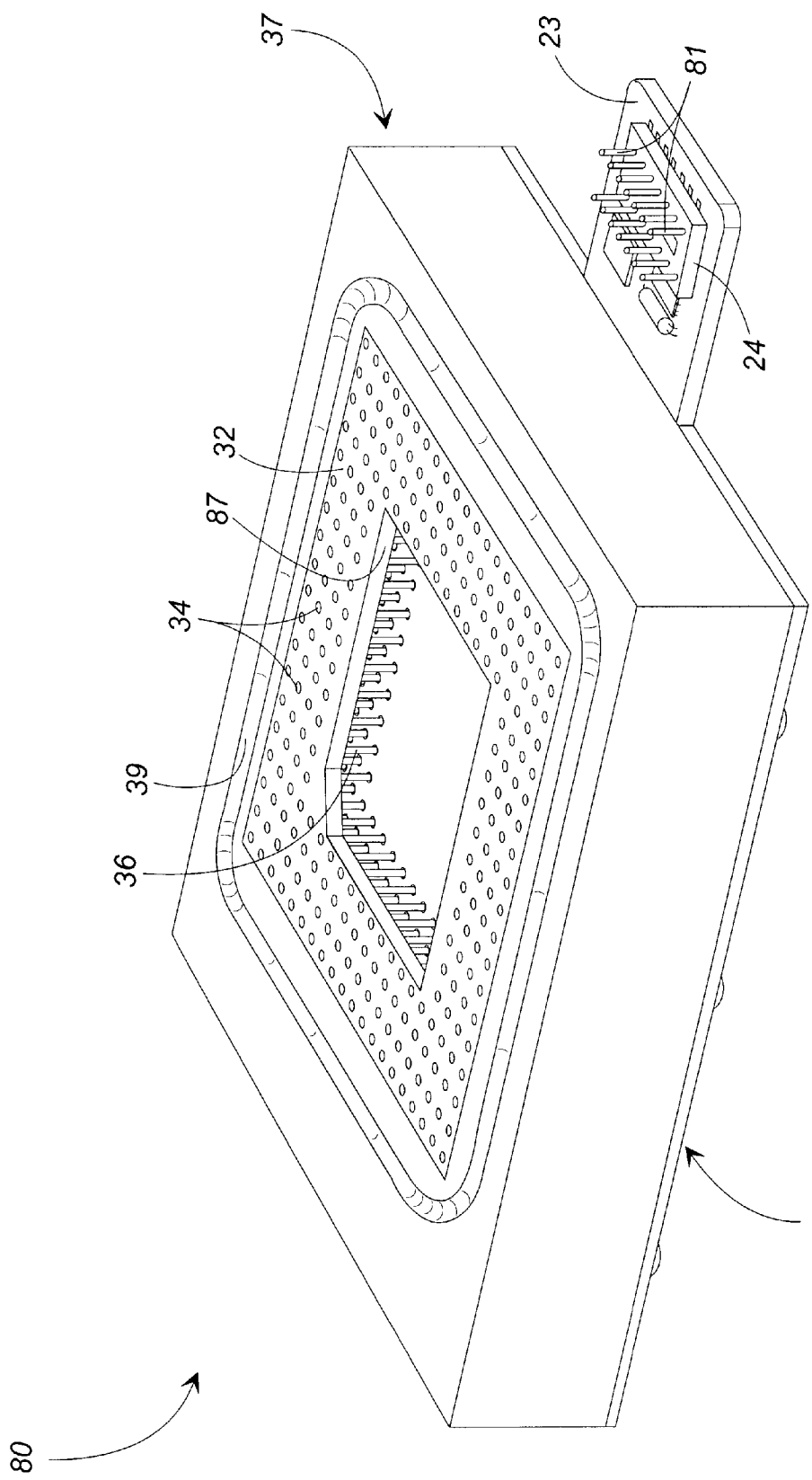
FIG. 4a is a perspective view of the thermal socket of FIG. 4 as it appears when assembled.

As best illustrated in FIG. 4a, when the heater board 26, insulating carrier 37, and socket 31 are properly assembled for use, the base 32 of the socket is embedded in and surrounded by the insulating carrier 37 with the top of the base substantially flush with the top of the carrier. The downwardly projecting legs 36 of the socket pins extend through the holes 27 in the heater board 26 and extend a predetermined distance downwardly from the bottom surface of the heater board to exposed ends. The exposed downwardly projecting ends of the legs 36 are then soldered or otherwise mounted to a mother board of a computer in the usual way. In this way, a CPU plugged into the socket 31 is directly coupled through the socket pins 33 to mother board of its computer as if it were mounted directly to the mother board itself. In practice, it is preferred that the insulating carrier 37 actually be molded around the socket 31 in order to provide a tight and secure mechanical and thermal seal between the carrier 37 and the socket 31. However, this is not a requirement of the invention and the carrier 37 could be molded separately from the socket 32 and the two assembled with epoxy or the like.

Referring again to FIG. 2, a gasket 41, preferably in the form of a rubber O-ring, is configured to be received in the gasket seat 39 formed in the insulating carrier 37. The gasket 41 functions to provide a seal of high integrity between the upper surface of the insulating carrier 37 and the main insulator housing that is mounted atop the carrier as described in more detail below.

A CPU chip 42 to be cooled by the present invention has an array of downwardly projecting connector pins 43. The chip 42 in the illustrated embodiment is provided with a heat spreader 44, which is formed from a thermally conducting material such as metal and is mounted to the top surface of the CPU chip. The heat spreader 44 is formed with a pair of spaced upstanding posts 46 for improved thermal coupling to a cold plate as described in more detail below. It should be understood that while some CPU chips are provided with heat spreaders to aid in chip cooling, others are not. Thus, while the invention is illustrated in the drawings as accommodating a CPU chip with a heat spreader, such is not a limitation of the invention and the invention is equally effective in cooling chips without heat spreaders. Further, some heat spreaders are devoid of the upstanding posts 46. The present invention is equally adaptable to all such CPU configurations and the particular configuration illustrated in the preferred embodiment should not be considered a limitation of the invention. In use, the CPU 42 is plugged into the socket 31 such that electrical connection is made between each connector pin 43 of the CPU and a corresponding socket pin 33 of the socket 31.

A main insulator housing 45 is formed by a lower section 47 and an upper section 50. Both the lower section 47 and the upper section 50 preferably are also molding from RIM foam because of its superior insulating and mechanical properties. However, other appropriate materials might be used with comparable results. The lower section 47 of the insulator housing 45 is formed with a central opening 48 sized to receive and surround the CPU chip 42 when the lower section 47 of the insulator housing is mounted atop the insulating carrier 37. In this regard, the gasket 41 provides a seal between the insulating carrier 37 and the bottom surface of the lower section 47 when the two pieces are mounted together. A spline 49 is formed in and projects upwardly from the top surface of the lower section 47 and substantially surrounds the opening 48 formed therein. The lower section 47 is also formed with a downwardly projecting leg 51 along one side. The leg 51 is contoured and configured to define a portion of a passageway for enclosing and insulating coolant lines 62 of a cold plate as detailed below.

The upper section 50 of the housing 45 has a bottom surface 52 that is formed with a groove 53 sized and positioned to receive the spline 49 of the lower section 47 when the two sections are mounted together. The spline and groove configuration properly aligns the two sections of the housing 45 and provides a seal between the two sections to prevent migration of ambient atmosphere into the device. An appropriate epoxy or other adhesive can also be used to secure the sections together and enhance the seal formed therebetween. A leg 54 projects downwardly from one side of the upper section 50 and is formed to compliment the leg 51 of the lower section such that when the two sections are joined together, the legs 51 and 54 define an enclosed insulated passageway for housing and insulating the coolant supply and return lines 62 of the cold plate 56.

The cold plate 56 is fabricated of thermally conductive material such as metal and has a pair of spaced openings 59 that are sized to receive the posts 46 of the heat spreader 44 on the CPU chip. Of course, in the case of heat spreaders without mounting posts, the cold plate 56 will have no spaced openings 59. In use, the cold plate 56 sits atop the heat spreader 44 of the CPU 52 with the posts 46 of the heat spreader extending through and being surrounded by the openings 59. In this way, when the cold plate 56 is chilled by introduction of coolant thereto, the heat spreader and CPU chip 42 are chilled in turn through thermal conduction of heat from the CPU to the cold plate. In practice, it is desired to chill the integrated circuit device 42 to a temperature of −40° C. or less in order to improve significantly the efficiency and operating speed of the chip. Such temperatures are easily achievable with the present invention.

The interior or bottom surface 52 of the upper section 50 of the insulator housing 45 is also formed with a pair of openings 61 that are sized and positioned to receive any portion of the posts 46 of the heat spreader 44 that project upwardly beyond the cold plate 56. A thermal plug 64 is configured to plug the tops of the openings 61 and, for this purpose, has a pair of downwardly projecting prongs 66 that plug, seal, and insulate the tops of the holes 61. An insulating top cover 67 is mounted to and covers the top of the entire assembly to provide closure and additional insulation. The thermal plug 64 and the top cover 67 are also preferably molded from RIM foam.

With the just described configuration, it will be appreciated that when the components shown in FIG. 2 are mounted together, the CPU 42 and the socket 31 become sealed within an insulated interior cavity defined by the main insulator housing 45, the insulating carrier 37, and the heater board 26. The cold plate 56 sits atop the CPU within the cavity and, when chilled, cools the CPU down to a predetermined below ambient temperature.

As the CPU is chilled to below ambient temperatures by the cold plate, its connector pins 43 also become chilled through thermal conduction and, in turn, the socket pins 33 of the socket 31 in which the connector pins are disposed are also chilled to a very low temperature. Normally, the exposed end portions of the socket pins 33 that project below the heater board 26 would also become chilled through thermal conduction and such chilling would result in moisture condensation on the pins and surrounding components. However, with the present invention, such chilling of the exposed ends of the socket pins is prevented and condensation does not occur. This is accomplished by applying power to the heating element 28 on the upper surface of the heater board 26 within the sealed insulated chamber, which heats the heating element and this heat is transferred to the socket pins where they extend into the heater board. This heat is then conducted through the socket pins to their exposed external end portions to heat the exposed ends of the socket pins to a temperature above a predetermined threshold higher than the local ambient dew point.

In practice, the predetermined threshold temperature of the socket pin ends is selected to be slightly greater than the ambient temperature inside a computer in which the present invention in employed. In this way, it is assured that the temperature of the exposed ends of the socket pins is always above the local dew point so that no moisture condensation is possible on the pins. In order to establish and maintain this threshold temperature, a temperature monitoring and control circuit, which is described in more detail below, is mounted to the heater board 26. The monitoring and control circuit constantly monitors the temperature of the projecting ends of the socket pins and applies power to the heating element 28 as necessary to insure that the temperature of the pins remains always above the predetermined threshold.

Figure 3A:
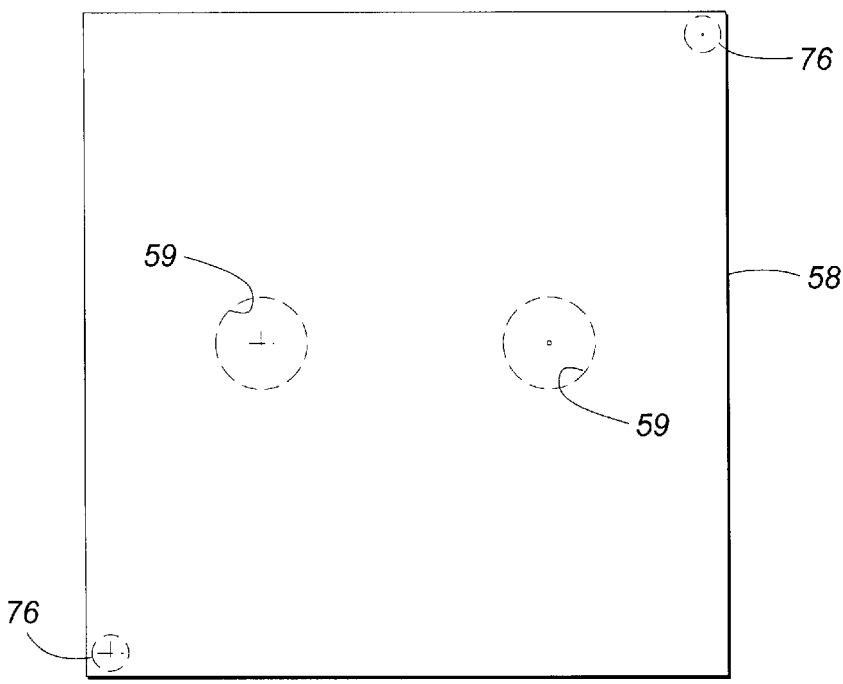
FIGS. 3a and 3b illustrate a preferred embodiment of the cold plate of the present invention for chilling an integrated circuit to below ambient temperatures.
Figure 3B:
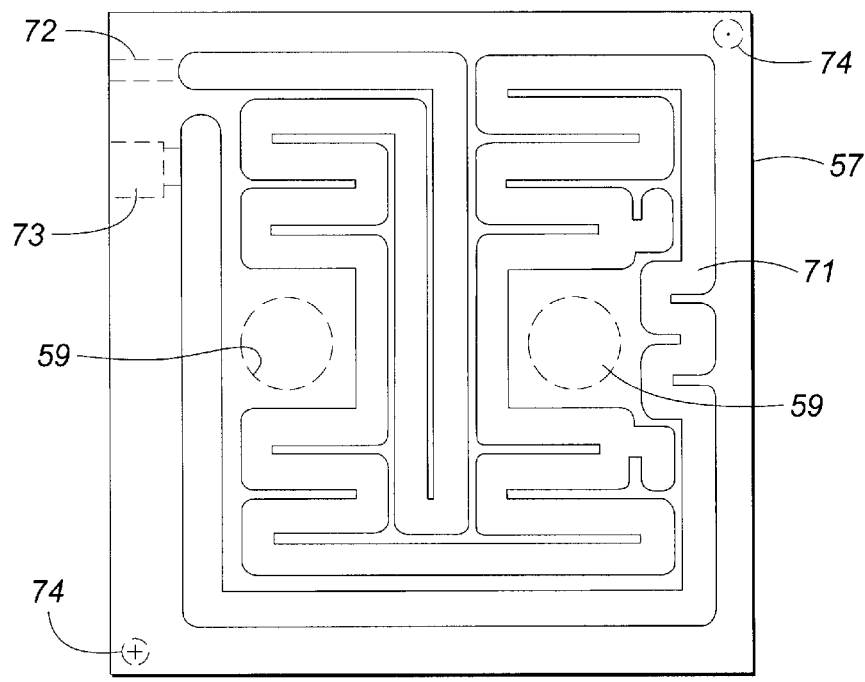

FIGS. 3*a* and 3*b* illustrate a preferred embodiment of the cover plate 58 and lower section 57 that, when secured together, form the cold plate 56 (FIG. 2). Moreover, the particular configuration shown in FIGS. 3*a* and 3*b* should not be considered limiting and a variety of configurations are possible within the scope of the present invention. The cold plate 56 (FIG. 2) comprises a lower section 57 (FIG. 3B) and an upper section or cover plate 56 (FIG. 3A). Both sections are formed from a material that is highly thermally conductive such as, for example, metal or another appropriate thermally conductive material. The lower section 57 of the cold plate is machined with a continuous serpentine channel 71 that snakes through the interior of the cold plate and surrounds the openings 59 formed therethrough. One end of the serpentine passageway terminates in a coolant inlet 72 and the other end terminates in a coolant outlet 73. In use, the cover plate 58 is secured and sealed to the top of the lower section 57 forming a sealed serpentine passageway extending and snaking through the cold plate. Coolant such as freon or a freon substitute is then delivered to the coolant inlet 72 of the cold plate. As the coolant traverses the serpentine passageway in the cold plate, it changes state from a liquid to a gas and expands accordingly. Since this a highly endothermic process, the cold plate is quickly cooled to below ambient temperatures. The expanded gaseous coolant then passes out of the cold plate through the coolant outlet 73 and is returned to an ancillary compressor for recompression back to a liquid state for recirculation.

FIGS. 4 and 4*a* illustrate the thermal socket portion of the present invention in an exploded perspective and an assembled perspective view respectively. As mentioned above, the purpose of this thermal socket is to prevent moisture condensation on the ends of the socket pins that project out of the assembly by maintaining these ends at a temperature above the local dew point. The thermal socket 85 is comprised of the heater board 26, the socket 31, and the insulating carrier 37. As mentioned above, the socket 31 is of conventional construction and includes a base 32 into which is embedded an array of socket pins 33. Each of the socket pins has an upper portion 34 defining a socket for receiving a corresponding connector pin of a CPU and an elongated depending pin portion 36 projecting downwardly from the base.

The heater board 26, which preferably is fabricated of standard printed circuit board material, has a generally rectangular field 83 from one side of which a connecting tab 23 projects. An array of pin receiving holes 27 are formed through the heater board 26 and are spaced and arranged to receive the socket pins 33 of the socket 31. When the socket 31 is mounted to the heater board 26, its pins extend through the heater board and project downwardly from the bottom surface thereof to exposed external end portions for mounting to a mother board or other circuit board.

A heating element in the form of a PTF resistor 28 is silk screen printed onto the upper surface of the heater board 26 surrounding the permeating the array of holes 27 formed therein. The thick film resistor 28 overlies metal terminal strips 29 disposed along opposed edges of the film and the terminal strips 29 are provided with holes 84 for connecting the strips to an external source of electrical power. When power is applied to the terminal strips 29, current flows through the PTF resistor, causing it to heat through ohmic heating. This heat, in turn, is transferred through thermal conduction to the socket pins 33 that project through the heater board causing the exposed end portions of the socket pins to be heated. A connector header 24 is mounted to the connecting tab 23 of the heater board for connecting electronic components 82 on the heater board to an external source of power and data.

The insulating carrier 37 has a central opening that surrounds and insulates the socket 31 when the insulated carrier 37 is mounted and sealed to the heater board 26 (FIG. 4a). When so assembled, the top surface of the socket 31 is flush with the top surface of the insulated carrier 37 and is poised to receive a CPU.

In use, the socket pins that extend through the heater board of the thermal socket must be isolated and electrically insulated from the currents flowing through the PTF resistor heating element so that such currents do not interfere with the normal operation of a CPU mounted in the socket. FIG. 5 illustrates a method of insuring such insulation and isolation. While only one socket pin and its corresponding heater board hole are shown in FIG. 5, it will be understood that each of the pins and holes are formed in a similar manner.

A pin receiving hole 91, which is slightly larger than the body 36 of the socket pin 33 is formed through the heater board 26. The PTF resistor heating element 28, which preferably is silk screen printed onto the heater board, is formed with an opening or void 92 that is centered on and surrounds the hole 91. This defines an isolation zone between the opening 91 and the heating element 28. Accordingly, when the socket pin 33 is inserted through the hole 91, it is spaced and electrically isolated from the material of the heating element 28. Thus, the socket pins are electrically isolated from the heating element so that no resistive connections are made between the pins and current flowing through the heating element does not interfere with signals transmitted through the socket pins 33. However, the heat generated by the heating element 28 is thermally coupled through the material of the heater board to the pins thus heating the exposed end portion of the socket pins beneath the heater board 26.

FIG. 6 is a side elevational partially sectioned view illustrating again the electrical isolation between the heating element 28 and the socket pins 36 and also illustrating a preferred means of sealing the socket pins in the heater board to prevent migration of ambient air into the sealed chamber of the cooling apparatus. As mentioned above, each pin 36 extends through a corresponding hole 91 formed through the heater board 26. The PTF resistor heating element 28, which is deposited on the top surface of the heater board 26, is formed with an opening 92 centered on each of the holes 91 that surrounds but does not contact the pin 36. The heating element 28 is thus electrically isolated from the pin 36.

In order to seal the pin 36 within the hole 91, an annular metal gusset 93 is printed on the bottom surface 90 of the heater board with standard printed circuit etching techniques. The pin 36 extends both through the opening 91 in the heater board and through the annular gusset 93. Solder 94 is then applied through solder reflow or other common circuit board soldering techniques to the pin and the gusset. The solder flows around the pin and bonds to the pin and the gusset to provide a mechanical seal of very high integrity and reliability. Thus, ambient atmosphere is prevented from seeping through the holes 91 into the sealed chamber containing the chilled CPU and, in this way, condensation inside the chamber is prevented.

When electrical power is supplied to the PTF heating element 28, the temperature of the heating element 28 rises through ohmic heating and this heat is transferred to the socket pins extending through the heater board 26. In the preferred embodiment, the temperature of the projecting exposed ends of the socket pins is monitored and power is applied to the heating element as necessary to maintain the temperature of these exposed ends above a predetermined threshold. Preferably, the predetermined threshold is selected to be slightly higher than the ambient temperature. In this way, the below ambient temperatures of the socket pins inside the cooling device do not cause the exposed ends of the pins outside the cooling device to become chilled as well. Accordingly, condensation or moisture and its attendant problems is eliminated.

Figure 7:
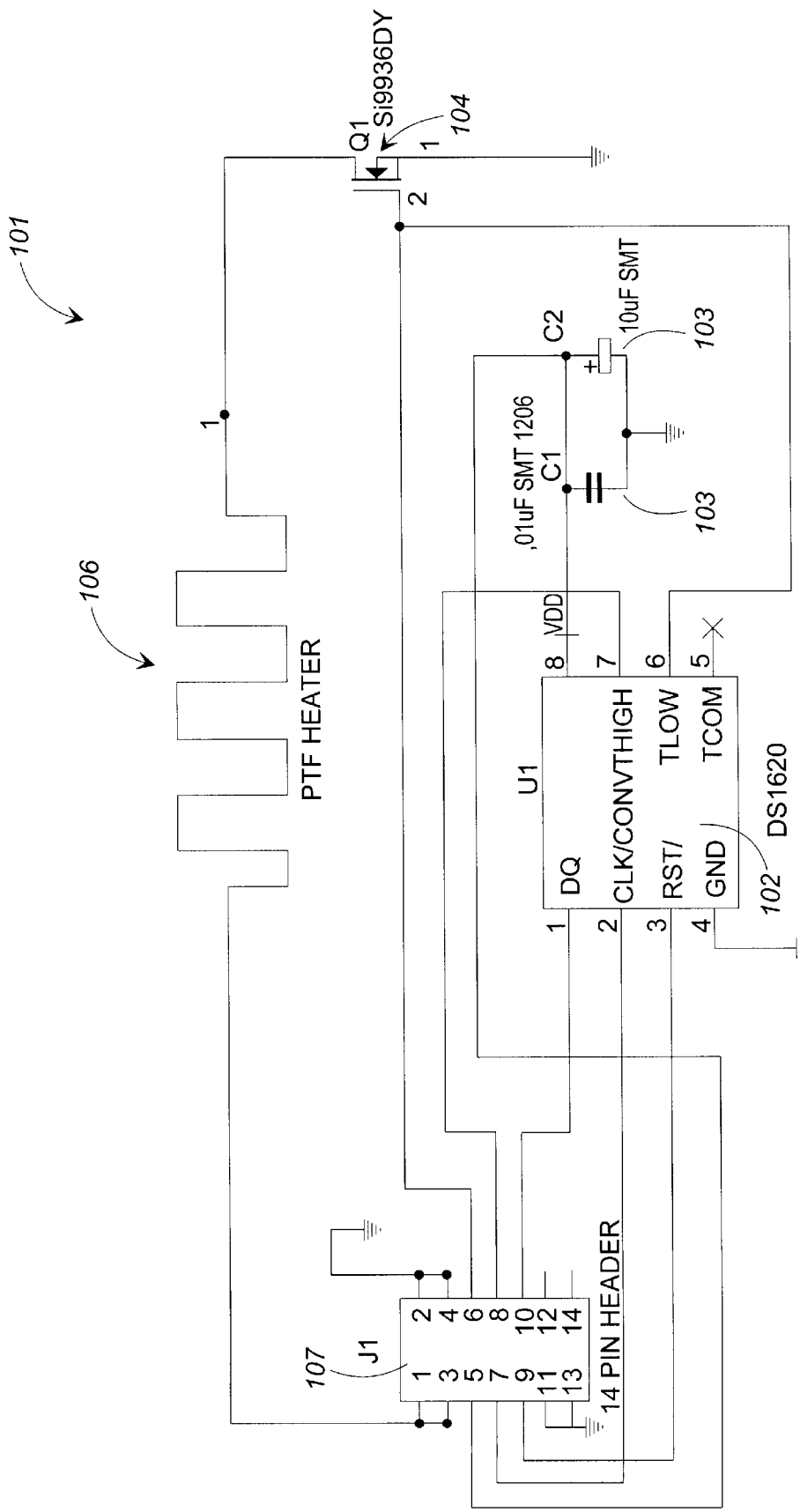
FIG. 7 is an electronic schematic diagram of a preferred thermostatic monitor and control circuit for maintaining the temperature of the exposed socket pins above a predetermined threshold.

FIG. 7 is an electronic circuit diagram illustrating a preferred circuit for monitoring the temperature of the exposed pins and controlling the heating element accordingly. The circuit comprises the PTF resistor heating element 106 that is connected to a source of power through a header 107 and to ground through a transistor switch 104. A digital thermostat 102 in the form of an integrated circuit, preferably a DS1620 chip available from Dallas Semiconductor, is mounted to the bottom surface of the heater board in the region of and adjacent to the protruding exposed end portions of the socket pins. The digital thermostat 102 receives operating power from an external power source through header 107 attached to the connector tab of the heating plate and filter capacitors 103 are employed to filter the operating voltage.

The digital thermostat chip 102 operates as follows. A predetermined low temperature set point and a predetermined high temperature set point are programmed into the digital thermostat chip from an external source through the header 107. If the ambient temperature in the vicinity of the chip falls below the low temperature set point, the output of the chip becomes high. If the temperature in the vicinity of the chip rises above the high temperature set point, the output of the chip becomes low. The output of the chip 102 is coupled through the header 107 to the base of transistor 104. When the output of the chip goes high, the transistor is turned on and connects the heater 106 and power source from the header 107 to ground. Current thus begins to flow through the heater and begins to heat the projecting pins. When the digital thermostat 102 senses that the temperature of the pin ends has risen above the high temperature set point, the output of the thermostat 102 goes low and the transistor 104 is turned off disconnecting the PTF heater from its power source. The temperature of the exposed pin ends then begins to fall until it falls below the low set point again and the cycle repeats. In this way the temperature of the projecting exposed pins of the device are maintained at a temperature within the range defined by the low and high temperature set points, which preferably is slightly higher than the local ambient temperature, and the heater is activated only as necessary to maintain such a condition.

The invention has been described in terms of preferred embodiments and methodologies. It will be obvious to those of skill in the art, however, that various modifications and extensions of the preferred embodiments might well be made. For example, while the invention has been described in terms of cooling a CPU chip, it is clearly equally applicable to cooling any type of integrated circuit device. Indeed, the method of the present invention is applicable to the prevention of condensation on exposed elements of any device where a component is chilled within a chamber and exposed elements projecting from the chamber are subject to becoming chilled through thermal conduction. More specifically, the preferred embodiment of the invention is directed to chips having traditional metal connector pins. In some modern CPU circuits, the CPU and perhaps other related components are mounted on their own small circuit board. This circuit board is then coupled to the main mother board with an edge connector. It should be well understood by those of skill in this art that the present invention is equally applicable to such configurations and that the scope of the invention is broader than that illustrated in the preferred embodiment. These and other additions, deletions, and modifications might well be made by persons of skill in the art without departing from the spirit and scope of the invention as set forth in the claims.

We claim:

1. An apparatus for cooling an integrated circuit device having projecting connector pins, said apparatus comprising:

a generally planar heater board having an array of openings formed therein;

a socket mounted to said heater board for receiving and electrically coupling to the integrated circuit device, said socket including a base member and an array of elongated socket pins projecting from said base member through said openings in said heater board to exposed external ends, each of said socket pins defining a receptacle on said base member for receiving a corresponding connector pin of the integrated circuit device;

means for sealing said socket pins in said openings formed in said heater board;

a housing mounted and sealed to said heater board, said housing defining a thermally insulated internal cavity sized to contain an integrated circuit device disposed in said socket;

a thermally conductive cooling element in said cavity, said cooling element being positioned in thermal contact with an integrated circuit device contained in said cavity and being coupled to a cooling system for cooling said cooling element and, in turn, the integrated circuit device, to a predetermined temperature; and heating means on said heater board for maintaining said exposed external ends of said socket pins at a predetermined temperature sufficiently high to prevent the condensation of moisture on said external end portions of said socket pins.

2. An apparatus for cooling an integrated circuit device as claimed in claim 1 and wherein said heating means comprises at least one resistive heating element on said heater board and means for supplying electrical power to said resistive heating element for heating said external end portions of said socket pins.

3. An apparatus for cooling an integrated circuit device as claimed in claim 2 and wherein said heater board has an interior surface disposed within said cavity and wherein said resistive heating element comprises a resistive film covering at least a portion of said interior surface of said heater board.

4. An apparatus for cooling an integrated circuit device as claimed in claim 3 and wherein said resistive film surrounds but is electrically isolated from said socket pins.

5. An apparatus for cooling an integrated circuit device as claimed in claim 4 and wherein said resistive film comprises a polymer thick film resistor.

6. An apparatus for cooling an integrated circuit device as claimed in claim 1 and wherein a metal gusset is printed on said heater board surrounding each of said openings and wherein said means for sealing said socket pins comprises solder attaching each of said socket pins to its corresponding metal gusset.

7. An apparatus for cooling an integrated circuit device as claimed in claim 6 and wherein said housing is mounted and sealed to said heater board with epoxy.

8. An apparatus for cooling an integrated circuit device as claimed in claim 1 and further comprising sensing and control means coupled to said socket pins and said heating means for monitoring the temperature of said external ends of said socket pins and controlling said heating means to maintain said external ends of said socket pins at a predetermined temperature.

9. An apparatus for cooling an integrated circuit device as claimed in claim 8 and wherein said sensing and control means comprises a digital thermostat mounted on said heater board in the vicinity of said external ends of said socket pins, said digital thermostat being adapted to activate said heating means when it is detected that the temperature of said external ends of said socket pins falls below a predetermined threshold.

10. An apparatus for cooling an integrated circuit device having projecting connector pins, said apparatus comprising a sealed thermally insulating cavity for containing the integrated circuit device, one side of said cavity being defined by a generally planar heater board, a socket mounted to said heater board for receiving the integrated circuit device and holding it in place within said cavity, said socket having an array of socket pins arranged to align with and receive the connector pins of the integrated circuit, said socket pins extending through said heater board to exposed external ends, a thermally conductive cooling element in said cavity for cooling the integrated circuit to a predetermined temperature, and a heater on said heater board for maintaining said exposed external ends of said socket pins above a predetermined temperature to prevent moisture condensation thereon.

11. An apparatus for cooling an integrated circuit device as claimed in claim 10 and further comprising a monitor and control circuit on said heater board for monitoring the temperature of said external ends of said socket pins and controlling said heater in response to the monitored temperature to maintain said external ends of said pins at a predetermined temperature.

12. An apparatus for cooling an integrated circuit device as claimed in claim 11 and wherein said heater comprises a resistive heating element on said heater board and wherein said control means is adapted to supply power selectively to said resistive heating element to generate heat.

13. An apparatus for cooling an integrated circuit device as claimed in claim 12 and wherein said resistive heating element comprises a polymer thick film resistor deposited on and covering at least a portion of said heater board.

14. An apparatus for cooling an integrated circuit device as claimed in claim 13 and wherein said polymer thick film resistor is deposited on said heater board within said sealed cavity and is electrically isolated from said socket pins.

15. An apparatus for cooling an integrated circuit device as claimed in claim 14 and further comprising means for sealing said socket pins within said heater board to prevent migration of ambient air into said cavity.

16. An apparatus for cooling an integrated circuit device as claimed in claim 15 and wherein said means for sealing comprises electrically isolated annular metal gussets on said heater board, each gusset surrounding a corresponding one of said socket pins and wherein said socket pins are sealed to said gussets.

17. An apparatus for cooling an integrated circuit device as claimed in claim 16 and wherein said socket pins are sealed to said gussets with solder.

18. An apparatus for cooling an integrated circuit device as claimed in claim 17 and wherein said heater board has an internal side within said cavity and an external side and wherein said gussets are located on said external side of said heater board.

19. A thermal socket for an integrated circuit device, said thermal socket comprising:
  a socket adapted to receive an integrated circuit device, said socket having an array of socket pins projecting therefrom;
  a heater board having an array of openings formed therethrough for receiving said socket pins of said socket;
  said socket being mounted to said heater board with said socket pins extending through said openings to exposed distal ends; and
  heating means on said heater board for maintaining the temperature of said exposed distal ends of said socket pins above a predetermined threshold.

20. A thermal socket as claimed in claim 19 and further comprising thermostatic control means on said heater board for monitoring the temperature of said exposed distal ends of said socket pins and activating said heating means as necessary to maintain the temperature of said exposed distal ends above said predetermined threshold.

21. A thermal socket as claimed in claim 20 and wherein said heating means comprises a resistive heating element.

22. A thermal socket as claimed in claim 21 and wherein said resistive heating element comprises a polymer thick film resistor deposited on said heater board in the vicinity of said socket pins.

23. A thermal socket as claimed in claim 22 and wherein said polymer thick film resistor is electrically isolated from said socket pins.

24. A thermal socket as claimed in claim 23 and further comprising an annular gusset formed on said heater board surrounding each of said socket pins and wherein each of said socket pins is sealed to its corresponding annular gusset with solder.

* * * * *